(12) United States Patent
Kahl et al.

(10) Patent No.: US 6,891,103 B2
(45) Date of Patent: May 10, 2005

(54) METHOD FOR PRODUCING A SHIELDING GASKET

(76) Inventors: Helmut Kahl, Horstwalder Strasse 23, Berlin (DE); Bernd Tiburtius, Rosenhag 10, Kleinmachnow (DE)

( * ) Notice: Subject to any disclaimer, the term of this patent is extended or adjusted under 35 U.S.C. 154(b) by 0 days.

(21) Appl. No.: 10/451,589

(22) PCT Filed: Nov. 27, 2001

(86) PCT No.: PCT/EP01/13777
§ 371 (c)(1),
(2), (4) Date: Jan. 20, 2004

(87) PCT Pub. No.: WO02/052913
PCT Pub. Date: Jul. 4, 2002

(65) Prior Publication Data
US 2004/0112938 A1 Jun. 17, 2004

(30) Foreign Application Priority Data
Dec. 23, 2000 (DE) .......................................... 100 64 968

(51) Int. Cl.$^7$ ............................................... H05K 9/00
(52) U.S. Cl. ............................. 174/35 MS; 174/35 GC; 277/919

(58) Field of Search ........................ 174/35 MS, 35 GC, 174/35 R; 277/919, 920; 361/799, 800, 816, 818; 428/364; 29/829, 835

(56) References Cited

U.S. PATENT DOCUMENTS

| 5,346,974 A | | 9/1994 | Iovine et al. |
| 5,904,978 A | * | 5/1999 | Hanrahan et al. ........ 428/313.5 |
| 6,096,413 A | | 8/2000 | Kalinoski et al. |
| 6,255,581 B1 | * | 7/2001 | Reis et al. ............. 174/35 GC |

FOREIGN PATENT DOCUMENTS

WO   WO 98/08364   2/1998

* cited by examiner

*Primary Examiner*—Dean A. Reichard
*Assistant Examiner*—Carmelo Oliva
(74) *Attorney, Agent, or Firm*—Altera Law Group, LLC

(57) ABSTRACT

The invention relates to a method for producing an electromagnetic shielding gasket by using a shielding compound that comprises a silicone plastic compound, electrically conducting parts and parts that expand under the influence of heat. The shielding compound is dispensed onto a housing and/or a circuit board and/or parts of the housing and is heat-treated after and/or during application, thereby providing the dispensed compound with the desired predetermined expansion and/or shape.

7 Claims, 2 Drawing Sheets expanded normally electrically conductive silicone e.g., non-expanded expanded normally electrically conductive silicone Gore stamped gasket dispensed gasket

METHOD FOR PRODUCING A SHIELDING GASKET

CROSS-REFERENCE TO RELATED APPLICATIONS

None

STATEMENT REGARDING FEDERALLY SPONSORED RESEARCH AND DEVELOPMENT

Not Applicable

INCORPORATION BY REFERENCE OF MATERIAL SUBMITTED ON A COMPACT DISC

Not Applicable

BACKGROUND OF THE INVENTION

1. Field of the Invention

The invention relates to a method for producing an electromagnetic shielding gasket.

2. Description of the Related Art

Electromagnetic shielding gaskets as well as methods for their production have long been known. In this connection, reference is made to the different applications of the present applicant as well as to the publications cited in the examination process relating to these applications.

Further, reference is made to the European patent application EP 0 779 629 A2. This application describes an electrically conducting composite material that has a polytetrafluoroethylene matrix as well as electrically conducting components and additional hollow polymer components that are expandable under the influence of heat. Also stated there is that the electrically conducting composite is to contain in addition an elastomeric material, which can consist of a silicone material. Although known from the above-named publication is the application of the material described and claimed there for the production of an electromagnetic shielding gasket, nevertheless it is very difficult, using the object described in EP 0779 629 A2, to produce a shielding gasket, particularly when the external tolerances are extremely small, for example in the range of a few millimeters of diameter.

The invention is based on the task of avoiding the disadvantages of the shielding gasket and of its production as known from EP 0 770 629 A2.

BRIEF SUMMARY OF THE INVENTION

The present embodiment is a method for producing an electromagnetic shielding gasket, comprising establishing a predetermined form for the electromagnetic shielding gasket; dispensing a shielding substance as at least one bead, wherein the shielding substance comprises a silicone plastic mass, electrically-conducting components and components that are expandable under the influence of heat; and treating the dispensed shielding substance with heat, thereby deforming the expandable components in the dispensed shielding substance, until the dispensed shielding substance substantially resembles the predetermined form.

DETAILED DESCRIPTION OF THE INVENTION

Figure 1A:
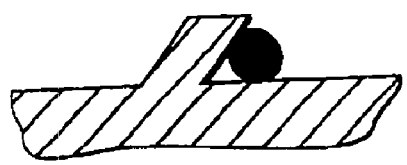
FIG. 1a illustrates a shielding substance in the presence of a guiding wall, before expansion.
Figure 1B:
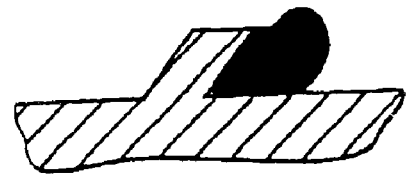
FIG. 1b illustrates a shielding substance in the presence of a guiding wall, after expansion.
Figure 2A:
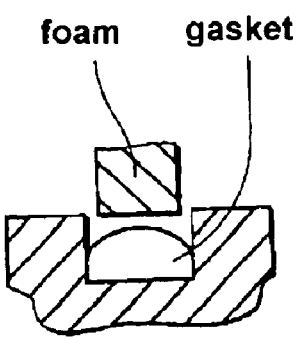
FIG. 2a illustrates a gasket in the presence of multiple guiding walls, before expansion.
Figure 2B:
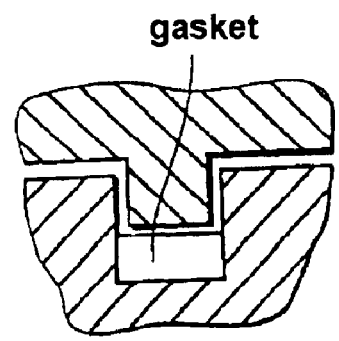
FIG. 2b illustrates a gasket in the presence of multiple guiding walls, before expansion.
Figure 2C:
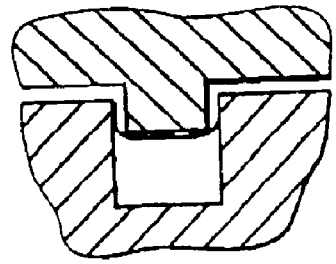
FIG. 2c illustrates a gasket in the presence of multiple guiding walls, after expansion.
Figure 3:
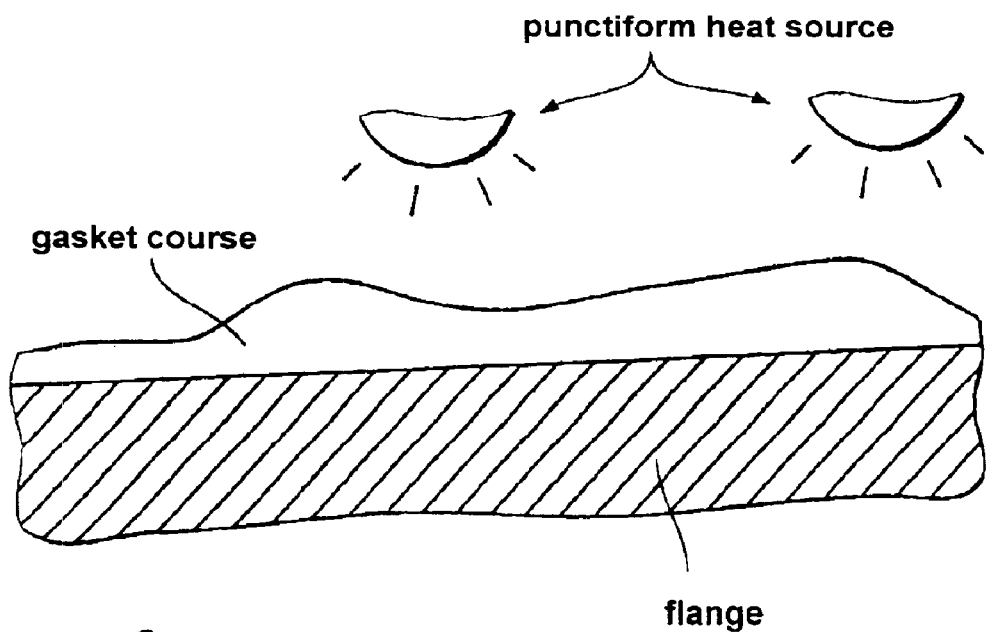
FIG. 3 illustrates a gasket forming a varying profile in response to a locally varying heat source.

According to the invention, the task is accomplished with a method according to claim 1 and with an electrical apparatus having a corresponding shielding gasket according to claim 6. Advantageous further developments are described in the dependent claims.

The essential difference between the present invention and the prior art according to EP 0 779 629 A2 consists in the fact that, in the invention, no polytetrafluoroethylene matrix is necessary for the construction of the shielding gasket. Rather, the electrical shielding gasket is produced through the dispensing of a shielding substance and a subsequent heat treatment of the dispensed compound, the heat treatment taking place until the dispensed compound obtains its predetermined expansion or form. The shielding substance contains electrically conducting components, for example silver particle, coal, metallic powder, etc., as well as expandable components, preferably expandable polymeric hollow spheres as well as silicone plastic.

The production of a dispensed shielding gasket is considerably more convenient and simple than is the production of a gasket as known from EP 0 779 629 A2.

In the method according to the invention, dispensing devices can be used for the dispensed application of the shielding substance and, after the dispensing, the heat treatment can take place either directly during the dispensing process or subsequently thereto in a heating chamber.

The micro hollow spheres can, for example, be such as are available from the firm Nobel Industries of Sundsvall, Sweden under the trade names ". . . ". Such micro hollow spheres can be obtained in a great variability of size and form with an expansion temperature lying primarily in the range between 70 and 130° C. A typical . . . micro hollow sphere has an initial-diameter dimension (i.e. not yet expanded) of 9 to 17 $\mu$m and, on average, an expanded diameter of 40 to 60 $\mu$m. Accordingly, the cubic-meter weight of the micro hollow spheres in the unexpanded state is approximately 1250 to 1300 kg/m$^3$, and in the expanded state approximately 20 to 30 kg/m$^3$.

In particular when the heat treatment takes place during the dispensing process of the shielding substance or shortly thereafter, it is possible to produce a large number of shielding gaskets within the shortest period of time in a simple manner, in which the dispensing robot, by means of which the shielding substance is applied to a housing, printed circuit board, or housing part, can easily adjust the dispensed application to the demands on the housing in each case. Also, such dispensing devices can be provided in a simple manner with a heat-generating apparatus, for example an infrared-radiation unit or a laser or another apparatus for heat generation, so that the expandable micro hollow spheres can expand.

The duration of the heat treatment is dependent on how far the dispensed shielding substance is to expand and what shape it must assume in the process.

After the heat treatment, the diameter of the shielding substance, which is applied, for example, as a bead or beads, is distinctly greater than prior to the heat treatment. The diameter expansion or widening of the diameter can be adjusted through the temperature and/or duration of the heat treatment such that the desired degree of expansion is achieved.

In particular when the dispensed application is not sufficient when using a conventional dispensed bead, for example, because the dispensed bead cannot completely bridge the gap between two housing parts, the use of the solution according to the invention is very expedient and cost-effective. The gasket according to the invention is especially suitable for waterproof sealing, whether for spray or even pressurized water. Also, it is possible to construct so-called guide walls, i.e. arranging crosspieces and flanges such that when an expansion occurs, the direction and/or form is roughly predetermined. Examples of this are represented in FIGS. 1, 2, 3, and 6.

The proportion of silicone (rubber) is the shielding substance can lie in the range between 20 and 70%, the proportion of the electrically conducting components in the range between 20 and 80% by volume (according to the fill material) of the output material, and the proportion of the micro hollow spheres in the range between approximately 1 and 25% by volume of the output material.

After the heat treatment the hardness grade (according to Shore A) of the shielding gasket according to the invention amounts to approximately 15 to 85; the proper hardness grade can be determined through selection of an appropriate plastic or duration of the heat treatment.

The absolute diameter of the shielding gasket can lie in the range of less than 1 mm to 30 mm.

The heat treatment for expansion of the entire shielding substance on the basis of the simultaneous expansion of the micro hollow spheres can also take place after the dispensing of the shielding substance and after the assembly of the housing, for example in a heat oven. Since the temperatures of the heat treatment are still relatively low and normally cause no destruction of the housing or housing part, such a treatment of the already-assembled housing results in the fact that through the expansion of the shielding substance, the latter is precisely distributed in the entire housing or in the gap between the adjacent housing parts, thus closing and sealing the housing such that electromagnetic radiation can no longer penetrate into the housing or escape from it. Moreover, at the same time an outstanding mechanical seal against moisture, liquid, or other objects such as dust is achieved.

After the expansion process, the shielding gasket is, as before, still elastic and even multiple openings and closings of the housing and the reassembly of housing parts is readily possible without causing damage to the corresponding shielding substance or significantly affecting the functionality of the shielding substance.

The heat treatment described in the present application can be carried out by means of a heated needle or nozzles or, if the gasket is already situated on a part, a simple heat aftertreatment can also be carried out. It is also possible, using the method according to the invention, to produce an electrically conducting foam, which can be dispensed onto a foil, for example.

Figure 4:
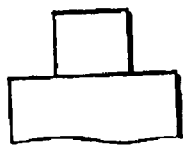
FIG. 4 illustrates a stamped gasket formed by a prior art method.

The essential difference between the method according to the invention and the proposal according to EP 0 779 629—FIG. 4—consists also in the fact that the known production method according to EP 0 779 629 requires six productions steps and is therefore very expensive. Essentially, the six production steps are drying (after the mixing), freezing, grinding up, extruding, pressing, and then applying to a foil, e.g. a telephone part. In the method according to the invention, in contrast, only the production steps mixing, applying, and expanding are required.

Figure 5:
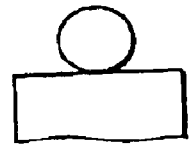
FIG. 5 illustrates a dispensed gasket in accordance with the present embodiment.
Figure 6A:
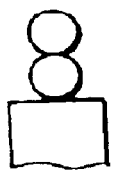
FIG. 6a illustrates a shielding substance dispensed as multiple, relatively small beads.
Figure 6B:
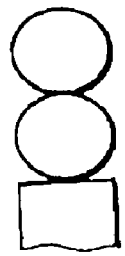
FIG. 6b illustrates a shielding substance dispensed as multiple, relatively large beads.

In comparison to PTFE (polytetrafluoroethylene), as disclosed in EP 0 779 629, silicone has a considerably better compression set value. In general, dispensed gaskets (see FIG. 5) also require lower pressing forces for deformation.

While according to the cited EP 0 779 629 silicone polymers are described as an admixture to the PTFE (polytetrafluoroethylene) mass, the electrically-conducting PTFE compounds also containing an elastomer, and in the production the individual components are mixed, dried (at 105° C. for 24 hours) and/or deep-frozen (−10° C. for 6 hours), sieved, diluted, stored at room temperature, extruded, dried, and expanded, the method according to the invention requires merely a mixing and the filling into cartridges of the gasket components according to the invention, and subsequently an application of the gasket, for example by means of dispensing using needles and nozzles, can take place. The expansion of the shielding substance through heat can occur either through a heating of the needle (nozzle) itself or the heat is applied after the application of the gasket.

Preferably, in the method according to the invention, after the dispensing a gasket with a semicircular cross section is present, which reduces the force necessary to deform the gasket later.

It is also important to state that in the method according to the invention the final shape of the gasket is, in all essentials, determined by the type and/or amount of the applied heat. In contrast to this, known from WO 98/08365 is a method in which the final gasket shape (in particular with respect to its cross section) is determined through the needle diameter (nozzle diameter), the application speed, or though the composition of the compound (viscosity, thixotropy, etc.) and/or through the application apparatus. Moreover, although the treatment of gaskets with heat after their application was previously generally known, this heat treatment nevertheless served only the purpose of cross-linking, drying, or hardening the silicone polymers, and had nothing to do with the concrete formation of the cross-sectional shape of the gaskets. The determination of the expansion and/or the shape of the shielding gasket in dependence on the concrete application of heat is the particular knowledge of the present invention and facilitates the production of an electromagnetic shielding gasket in particular application forms and, in comparison to the known solutions, makes this production more cost-efficient.

What is claimed is:

1. A method for producing an electromagnetic shielding gasket, comprising:

establishing a predetermined form for the electromagnetic shielding gasket;

dispensing a shielding substance as at least one bead, wherein the shielding substance comprises a silicone plastic mass, electrically-conducting components and components that are expandable under the influence of heat; and treating the dispensed shielding substance with heat, thereby deforming the expandable components in the dispensed shielding substance, until the dispensed shielding substance substantially resembles the predetermined form.

2. The method of claim 1, wherein the expandable components have a diameter in the range of approximately 2 to 50 μm in the non-expanded state, and have a diameter in the range of approximately 30 to 200 μm in the expanded state.

3. The method of claim 1, wherein the expandable components are micro hollow polymeric spheres, which are electrically nonconductive and are enlargeable in size through heat treatment by a factor in the range of approximately 5 to 70 in volume.

4. The method of claim 1, wherein during the heat treatment the temperature of the dispensed shielding substance is in the range of approximately 50° C. to 140° C.

5. The method of claim 1, wherein after the dispensing and after the heat treatment the dispensed shielding substance is essentially circular in cross section.

6. The method of claim 1, further comprising providing guide walls for the dispensed shielding substance during the heat treatment, so that the dispensed shielding substance expands around the guide walls and assumes a shape roughly predetermined by the guide walls.

7. The method of claim 1, wherein different portions of the dispensed shielding substance undergo a different heat treatment, so that the dispensed shielding substance may achieve local expansions that allow for more complex final shapes and may lower the possible physical deformation forces.

* * * * *

UNITED STATES PATENT AND TRADEMARK OFFICE
CERTIFICATE OF CORRECTION

PATENT NO. : 6,891,103 B2
DATED : May 10, 2005
INVENTOR(S) : Kahl et al.

It is certified that error appears in the above-identified patent and that said Letters Patent is hereby corrected as shown below:

<u>Title page,</u>
Item [30], Foreign Application Priority Data, the number should read
-- 100 64 968.8 --.

Signed and Sealed this

Thirteenth Day of December, 2005

JON W. DUDAS
*Director of the United States Patent and Trademark Office*